United States Patent [19]

Tanaka

[11] Patent Number: 5,264,808
[45] Date of Patent: Nov. 23, 1993

[54] SUBSTRATE POTENTIAL ADJUSTING APPARATUS

[75] Inventor: Hiroaki Tanaka, Yokohama, Japan

[73] Assignee: Kabushiki Kaisha Toshiba, Kawasaki, Japan

[21] Appl. No.: 841,535

[22] Filed: Feb. 26, 1992

[30] Foreign Application Priority Data

Feb. 27, 1991 [JP] Japan .................................... 3-33201

[51] Int. Cl.[5] .......................... H03B 5/24; H03K 3/01
[52] U.S. Cl. ...................................... 331/57; 331/49; 331/179; 307/296.2
[58] Field of Search ................. 331/57, 48, 49, 108 C, 331/111, 143, 177 R, 179; 307/296.2

[56] References Cited

U.S. PATENT DOCUMENTS 4,336,466  6/1982  Sud et al. ................... 331/108 C X
4,656,369  4/1987  Lou ................................ 331/57 X
4,883,976  11/1989  Deane .......................... 307/296.2

Primary Examiner—David Mis
Attorney, Agent, or Firm—Foley & Lardner

[57] ABSTRACT

A substrate potential adjusting apparatus of the invention includes: a pump circuit for drawing a current from a semiconductor substrate to adjust a substrate potential; ring oscillators for supplying a periodical signal to the pump circuit and causing the pump circuit to operate; a limiter circuit for detecting a potential of the semiconductor substrate and controlling to switch between operation and non-operation of the ring oscillators in accordance with the detected potential; and a selector circuit for changing the oscillation period of the periodical signal outputted from the ring oscillators in accordance with a signal inputted externally from a chip, the signal determining an operation mode of a circuit formed on the semiconductor substrate.

15 Claims, 5 Drawing Sheets

SUBSTRATE POTENTIAL ADJUSTING APPARATUS

FIELD OF THE INVENTION

The present invention relates to a substrate potential adjusting apparatus, and more particularly to a substrate potential adjusting apparatus suitable for application to semiconductor devices having a substrate potential setting function.

BACKGROUND OF THE INVENTION

FIG. 1 is a block diagram showing the structure of a conventional substrate potential adjusting apparatus, in particular an apparatus having a limiter. As shown in FIG. 1, a pump circuit 2 draws a current $I_{BB}$ from a semiconductor substrate 4 formed with a desired circuit thereon to thereby set the substrate to a certain voltage (substrate voltage) $V_{BB}$. The pump circuit 2 is supplied with a periodical signal from a ring oscillator 1 which starts or stops oscillation in response to a control signal SLMT from a limiter circuit 3. A leak current $I_{leak}$ usually flows through the substrate 4 from the limiter circuit 3.

The operation of the substrate potential adjusting apparatus constructed as above will be described with reference to a timing chart shown in FIG. 2. This timing chart shows the substrate voltage $V_{BB}$ changing with time.

The limiter circuit 3 always monitors the substrate voltage $V_{BB}$. When the substrate voltage $V_{BB}$ rises, the limiter circuit supplies the control signal SLMT to the ring oscillator 1. The ring oscillator 1 then starts operating and supplies a periodic signal to the pump circuit 2, so that the substrate 4 is set to the voltage $V_{BB}$. This operation corresponds to the period I in FIG. 2. After the substrate voltage $V_{BB}$ is lowered, the limiter circuit 3 performs a limiter operation. Specifically, the control signal SLMT is inverted and the ring oscillator 1 stops its operation. As a result, the pump circuit 2 stops and the current $I_{BB}$ flows into the substrate 4 from the limiter circuit 3 to raise the substrate voltage $V_{BB}$. This operation corresponds to the period II in FIG. 2. During the period III inclusive of the period I and the period II, the leak current $I_{leak}$ always flows through the substrate 4 from the limiter circuit 3. Since $I_{BB} \gg I_{leak}$, the voltage $V_{BB}$ can be established by drawing the current $I_{BB}$.

As described above, during the period I, the ring oscillator 1 and pump circuit 2 operate in response to the control signal SLMT from the limiter circuit 3. Therefore, a large current is consumed. When the substrate 4 is set to the voltage $V_{BB}$ by the current $I_{BB}$, the limiter circuit 3 detects it. At this state, the period II starts. During the period II, the control signal SLMT from the limiter circuit 3 is inverted to stop operating the ring oscillator 1 and pump circuit 2. Therefore, only the leak current $I_{leak}$ flows through the substrate 4, reducing an average current.

In other words, the period I is the operation period of the ring oscillator 1 during which the current $I_{BB}$ is drawn from the substrate. The period II is the operation stop period of the ring oscillator 1 and pump circuit 2 during which $I_{BB}$ is zero. The period III is the period during which the current $I_{leak}$ flows through the substrate 4 from the limiter circuit 3.

The relation between the substrate voltage $V_{BB}$ and power supply voltage $V_{DD}$ is shown in FIG. 3A. In FIG. 3A, $\alpha$ represents the characteristic of the pump circuit 2 assuming that the ring oscillator 1 operates always, and $\beta$ represents the characteristic of the limiter circuit 3. The relation of total consumption current $I_{DD}$ and power supply voltage $V_{DD}$ is shown in FIG. 3B.

In FIGS. 3A and 3B, in the region A, a potential set by the pump circuit 2 is shallower than a potential set by the limiter circuit 3. Therefore, in this region A, the ring oscillator 1 and pump circuit 2 always operate, and the consumption current $I_{DD}$ increases greatly as the power supply voltage $V_{DD}$ becomes high. In the region B, a potential set by the pump circuit 2 is deeper than a potential set by the limiter circuit 3. Therefore, in this region B, under control of the limiter circuit 3, the substrate voltage $V_{BB}$ remains at the substrate voltage $V_{BB}$ determined by the characteristic of the limiter circuit 3, and the ring oscillator 1 and pump circuit 2 operate intermittently, reducing the total consumption current. Namely, in the region A, the ring oscillator 1 and pump circuit 2 always operate, and in the region B, the ring oscillator 1 and pump circuit 2 operate intermittently under control of the limiter circuit 3. A peak current $I_{DDpeak}$ is therefore present at a peak power supply voltage $V_{DDP}$ at the boundary between the regions A and B. The peak power supply voltage $V_{DDP}$ is determined as an intersection between the characteristic lines of the pump circuit 2 and limiter circuit 3.

A conventional substrate potential adjusting apparatus has been structured in the manner described above. With such an apparatus, the peak power supply voltage $V_{DDP}$ (at which the peak current $I_{DDpeak}$ flows) is smaller than 4.5 V within the power supply voltage $V_{DD}$ range from 4.5 V to 5.5 V. Therefore, a peak consumption current will not appear within the rated power supply voltage range, posing no practical problem. If low power consumption such as during battery backup is to be expected, it is necessary to consider a low voltage operation. In this case, a presence of a peak consumption current should be taken into consideration. For example, consider the case where an operation voltage is set about 3V near the peak power supply voltage $V_{DDP}$. This case is associated with the problem of the peak consumption current, so that it is difficult to realize such low power consumption. It is conceivable to provide a countermeasure against this by setting the voltage during a low voltage operation slightly higher than the peak power supply voltage $V_{DDP}$. With this setting, however, a battery is rapidly consumed by the peak current as the supply voltage of the battery lowers.

SUMMARY OF THE INVENTION

The present invention has been made considering the above situations. It is an object of the present invention to reduce the total power consumption of circuits formed on a semiconductor substrate by introducing a low voltage operation and lowering a peak current, while adjusting the potential of the semiconductor substrate.

Pump means operates in response to a periodic signal from oscillator means, to draw a current from a semiconductor substrate. Control means and selection means controls the on/off and oscillation period of the oscillator means, in accordance with the potential of the semiconductor substrate and the operation mode of the circuits formed on the substrate. In this manner, the consumption current of the circuits is reduced.

As above, according to the substrate potential adjusting apparatus of the present invention, the period of a ring oscillator is elongated in response to a signal inputted externally from a chip, to thereby reduce a peak current. Therefore, low power consumption is possible at a low voltage operation, and the reliability of circuits of a battery backup apparatus can be improved.

DESCRIPTION OF THE PREFERRED EMBODIMENTS

Preferred embodiments of the present invention will be described with reference to the accompanying drawings.

Figure 1:
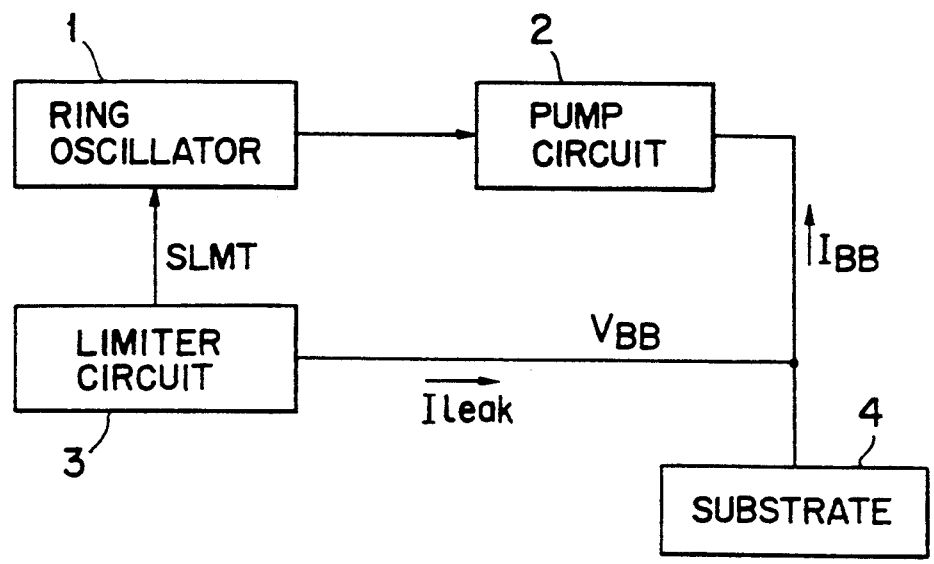
FIG. 1 is a block diagram of a conventional substrate potential adjusting apparatus.
Figure 2:
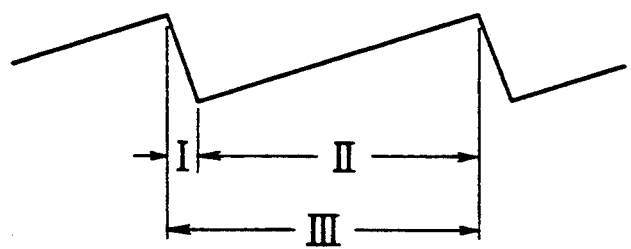
FIG. 2 is a timing chart explaining the operation of the circuit shown in FIG. 1.
Figure 3A:
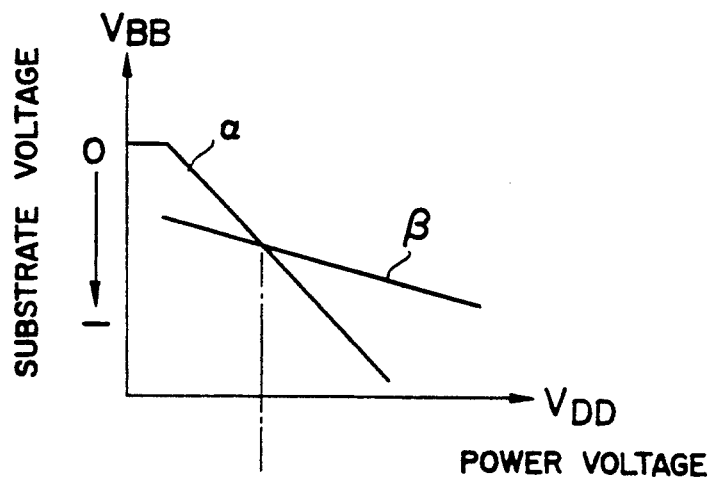
FIGS. 3A and 3B are graphs showing the characteristics of the circuit shown in FIG. 1.
Figure 3B:
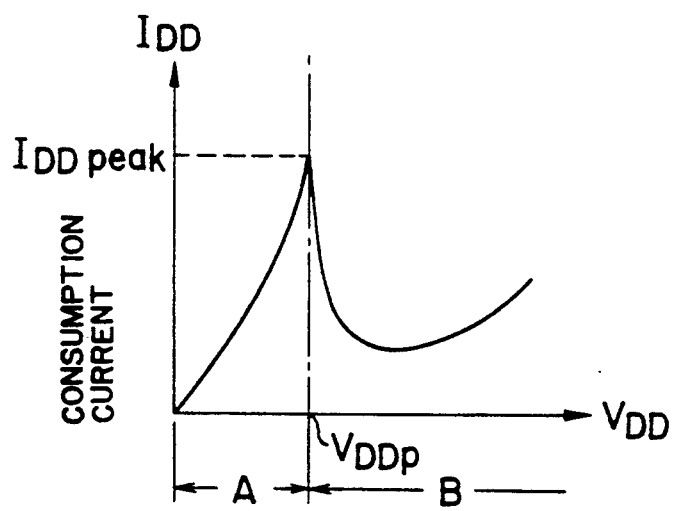
Figure 4:
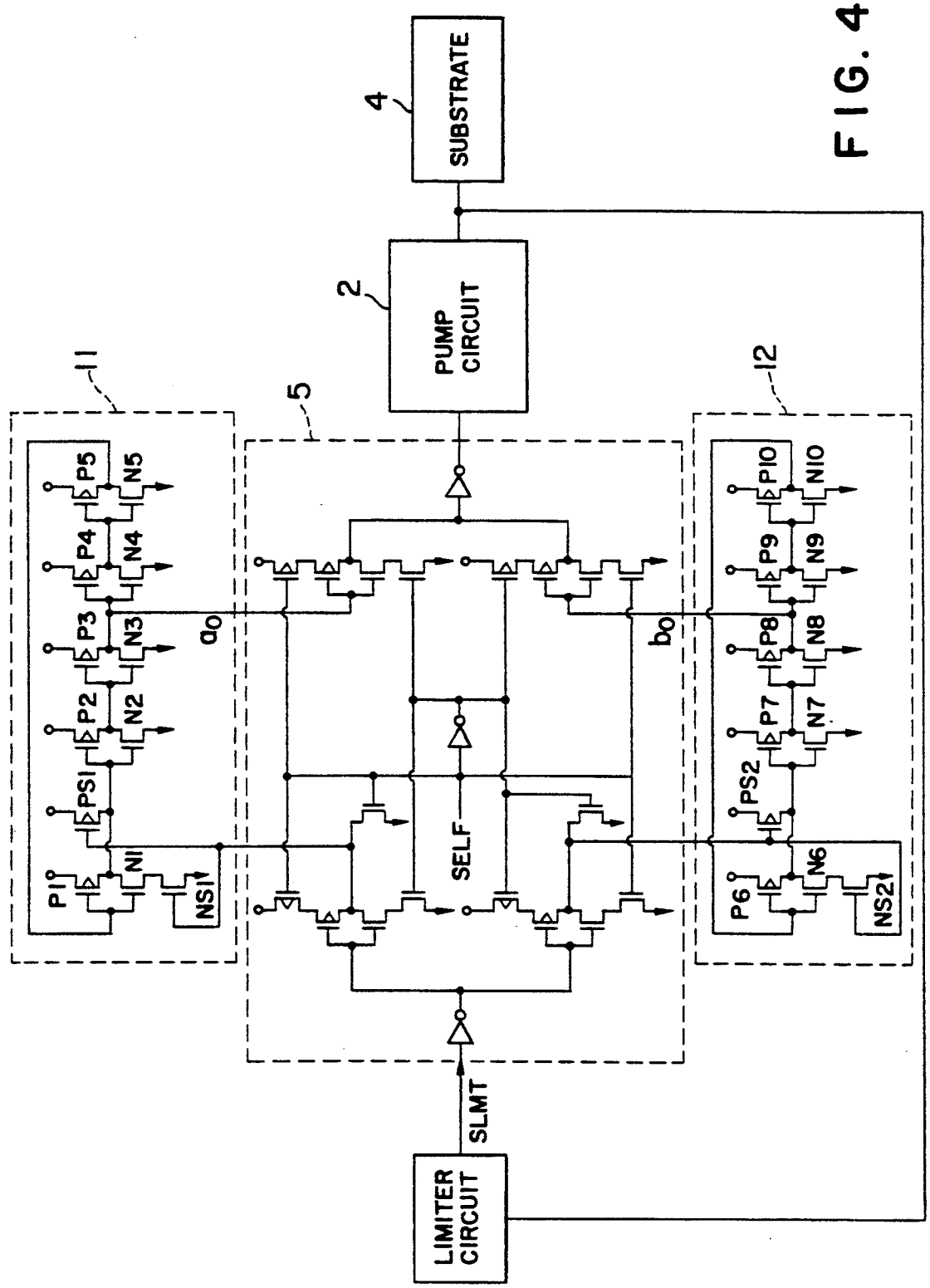
FIG. 4 is a block diagram showing an embodiment of a substrate potential adjusting apparatus according to the present invention.

FIG. 4 is a block diagram showing an embodiment of the substrate potential adjusting apparatus according to the present invention. In FIG. 4, like elements to those shown in FIG. 1 are represented by using identical reference, numerals. A first ring oscillator 11 generates a periodic signal (first periodic signal) having the period same as the conventional ring oscillator. A second ring oscillator 12 on the other hand generates a periodic signal (second periodic signal) having a period, e.g., twice as long as the conventional period. A selector circuit 5 causes one of the first and second ring oscillators 11 and 12 to selectively operate. A selected one of the first and second ring oscillators 11 and 12 supplies a corresponding one of the first and second periodic signals to a pump circuit 2. The selector circuit 5 is supplied with a control signal SLMT and a self-refresh selection signal SELF. In a normal cycle, the selector circuit 5 receives the control signal SLMT and self-refresh selection signal SELF (normal state), and causes the first oscillator 11 to operate and supply the first periodic signal to the pump circuit 2. In a self-refresh cycle, the selector circuit 5 receives the control signal SLMT and self-refresh selection signal SELF (self-refresh state), and causes the second ring oscillator 12 to operate and supply the second periodic signal to the pump circuit 2. The first ring oscillator 11 is constructed of P-channel transistors P1 to P5 and N-channel transistors N1 to N5. These transistors have a short channel length L and a large drive current capacity. From this reason, the first ring oscillator 11 is arranged to generate the first periodic signal having a short period. A P-channel transistor PS1 and N-channel transistor NS1 are switching transistors for the first ring oscillator 11. The second ring oscillator 12 is constructed of P-channel transistors P6 to P10 and N-channel transistors N6 to N10. These transistors have a long channel length L and a small drive current capacity. From this reason, the second ring oscillator 12 is arranged to generate the second periodic signal having a longer period, e.g., twice as long as the conventional ring oscillator. A P-channel transistor PS2 and N-channel transistor NS2 are switching transistors for the second ring oscillator 12.

Figure 5:
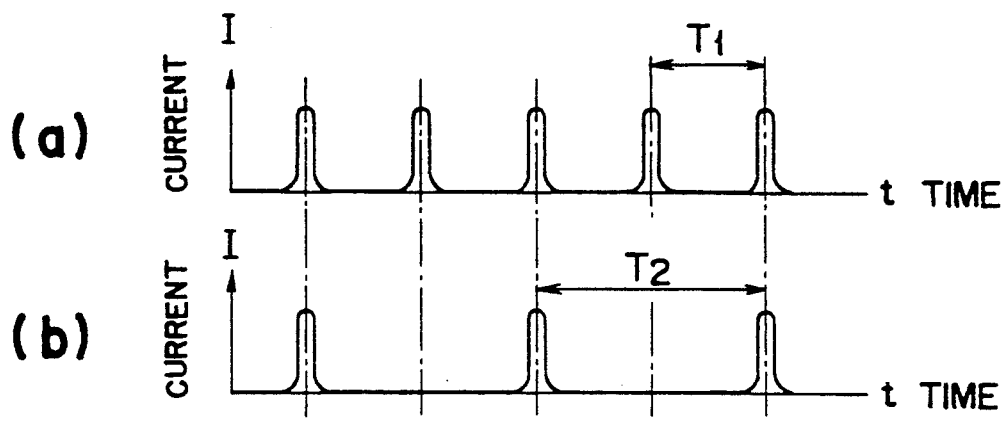
FIG. 5 is a timing chart explaining the operation of the circuit shown in FIG. 4.
Figure 6:
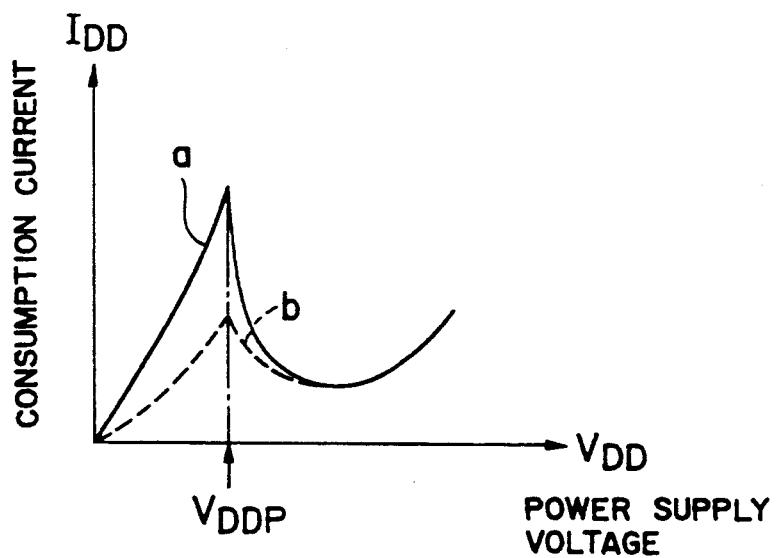
FIG. 6 is a graph showing the characteristic of the circuit shown in FIG. 4.

The operation of the substrate potential adjusting apparatus constructed as above will be described with reference to the timing charts shown in FIGS. 5(a) and 5(b) and the graph shown in FIG. 6. FIG. 5 shows a change of an operation current I of the pump circuit 2 relative to time t. FIG. 6 shows the relation between a power supply voltage $V_{DD}$ and consumption current $I_{DD}$ during the normal cycle and self-refresh cycle.

For those memories requiring refresh, the self-refresh selection signal SELF takes a low level and the control signal SLMT takes a high level when necessary, respectively in the normal cycle. In the normal cycle, the first ring oscillator 11 operates to activate the pump circuit 2 so that the current $I_{BB}$ is drawn from the substrate 4. When the control signal SLMT takes the low level, the first ring oscillator 11 stops so that the pump circuit 2 will not draw the current $I_{BB}$ from the substrate 4. In other words, during the normal cycle, the control signal SLMT is supplied only to the first ring oscillator 11, and only an output $a_0$ of the first ring oscillator 11 is supplied to the pump circuit 2. In the self-refresh cycle, the self-refresh selection signal SELF takes the high level. Therefore, the control signal SLMT is supplied only to the second ring oscillator 12 which then enters the active state. When the control signal SLMT takes the high level, only an output $b_0$ of the second ring oscillator 12 is supplied to the pump circuit 2.

The above-described operation of the circuit shown in FIG. 4 leads to the following understanding. Consider the case where a self-refresh mode is automatically and continuously repeated in a low voltage operation (e.g., at a voltage of about 3 V) for memory chips requiring refresh. In such a case, low power consumption has been impossible conventionally because of a peak current. However, according to the present invention, in the self-refresh mode, the period while drawing the current $I_{BB}$ from the substrate 4 is made long. As a result, as shown in the graph of FIG. 6, a consumption current $I_{DD}$ curve b during the self-refresh cycle takes a lower value than a consumption current $I_{DD}$ curve a during the normal cycle, lowering a peak current $I_{DD\text{-}peak}$ at a peak power supply voltage $V_{DDP}$ and hence a consumption current $I_{DD}$. Specifically, consider a consumption current $I_{DD}$ when the first periodical signal is supplied to the pump circuit 2 as shown in FIG. 5(a), and a consumption current $I_{DD}$ when the second periodic signal is supplied to the pump circuit 2 as shown in FIG. 5(b). In the case shown in FIG. 5(b), the operation current of the pump circuit 2 per unit time can be reduced, resulting in a reduced average current. It is to be noted that an increase of consumption current caused by provision of the first and second ring oscillators 11 and 12 can be neglected.

In this embodiment, the channel length L of each transistor constituting ring inverters of the second ring oscillator 12 is made longer so as to make the period of the second ring oscillator 12 longer than the first ring oscillator 11. Instead, the channel width W may be made narrower. A capacitor may be connected to the output node of each of the ring inverters of the second ring oscillator 12.

Figure 4A:
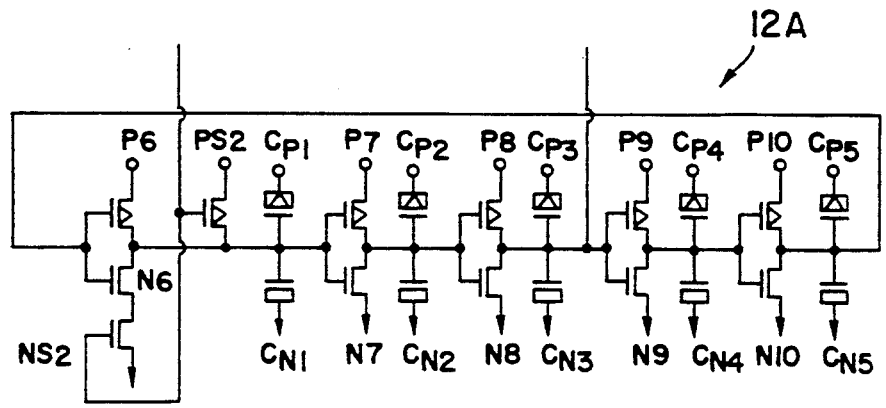
FIG. 4A is a circuit diagram showing a ring oscillator 12A of the type that the ring oscillator 12 shown in FIG. 4 is connected with capacitors.

FIG. 4A is a circuit diagram showing a ring oscillator 12A with capacitors $C_{P1}/C_{N1}$ to $C_{P5}/C_{N5}$ connected.

In this embodiment, the period of a signal supplied to the pump circuit 2 is changed between the normal cycle and self-refresh cycle by exchanging the first and second ring oscillators 11 and 12. Instead, the period of the ring oscillator may be changed between the active state and standby state, in accordance with the level of an externally inputted chip control signal. With such an arrangement, a low voltage operation and low power consumption are possible during the standby state. In this case, the self-refresh selection signal SELF shown in the circuit of FIG. 4 is replaced by a control signal $CE_{in}*$ within a chip for switching between the active state and standby state. The level of this control signal $CE_{in}*$ is low in the active state, and high in the standby state.

Figure 4B:
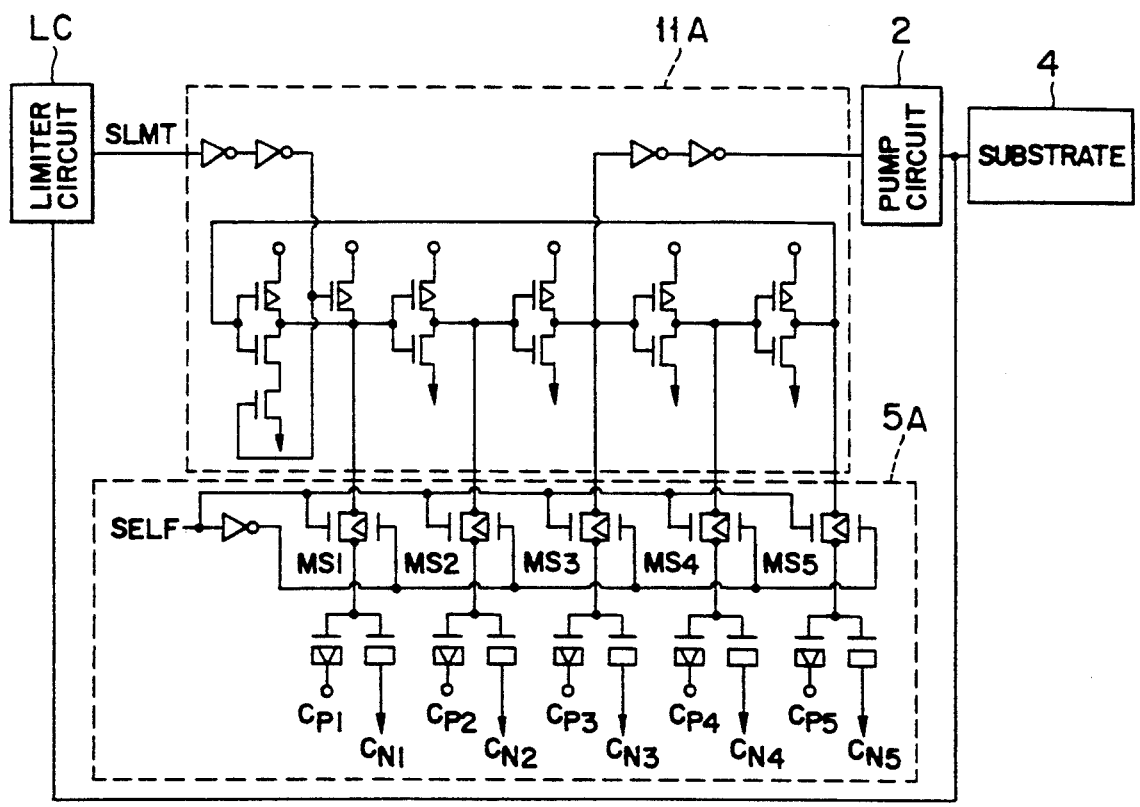
FIG. 4B is a circuit diagram of a substrate potential adjusting apparatus whose ring oscillator is frequency variable.

FIG. 4B shows an embodiment wherein the period of a ring oscillator is changed in accordance with an externally inputted chip control signal.

During the normal cycle (SELF: low level), MOS switches MS1 to MS5 connected to output nodes of a ring oscillator 11A turn off. Therefore, the capacitors $C_{P1}/C_{N1}$ to $C_{P5}/C_{N5}$ are electrically disconnected from the output nodes, and so the period of the ring oscillator 11A can be shortened. During the self refresh cycle (SELF: high level), the MOS switches MS1 to MS5 turn on. Therefore, the capacitors $C_{P1}/C_{N1}$ are electrically connected to the output nodes, and so the period of the ring oscillator 11A can be elongated.

The circuit shown in FIG. 4B switches the period of the ring oscillator between the normal cycle and self refresh cycle. However, in switching the period of the ring oscillator between the active state and standby state, the self refresh selection signal SELF is replaced by a control signal CE* within the chip for switching between the active state and standby state. The level of the control signal CE* is set to low level during the active state, and to high level during the standby state.

In the case of a longer period of the ring oscillator for the self-refresh cycle than the normal cycle the peak current $I_{DDpeak}$ at the peak power supply voltage $V_{DD}$ can be reduced during the self-refresh cycle as shown in FIG. 6 and described previously. Therefore, low power consumption can be realized at a low voltage operation during the self-refresh cycle, so the period of battery backup for a hand-carry type apparatus can be elongated. Furthermore, in the intermittent operation range (power supply voltage $V_{DD} \gg$ peak power supply voltage $V_{DDP}$), there is no change in the electric charge amount per one pump operation of the pump circuit, and no change in the leak current from the limiter circuit. The consumption current changes scarcely even if the period of the ring oscillator is made long.

If the normal cycle mode is set upon power-on, the pump function ability is not degraded. With such an arrangement, a failure such as latch-up of a CMOS structure can be prevented which might be caused otherwise by a rise of the substrate potential upon power-on.

In the above embodiment, the period of the ring oscillator is elongated for the self-refresh cycle than the normal cycle. The similar advantageous effects of this embodiment can also be obtained for the case of a longer period of the ring oscillator for the standby state than the active state, as described previously.

Further, in the case of a longer period of the ring oscillator for the self-refresh cycle than the normal cycle, the cycle period in the normal cycle mode is several tens ns to several hundreds ns, and the cycle period in the self-refresh mode is several hundreds $\mu$s. Therefore, even with a lower pump function ability in the self-refresh mode, the shift of the substrate potential caused by the operation of internal circuits can be sufficiently remedied until the next cycle.

What is claimed is:

1. A substrate potential adjusting apparatus comprising:

pump means for drawing a current from a semiconductor substrate to adjust a substrate potential;

oscillator means for supplying a periodic signal to said pump means and causing said pump means to operate;

control means for detecting a potential of said semiconductor substrate and for controlling switching of said oscillator means between operation and non-operation in accordance with said detected potential;

selection means for changing the oscillation period of said periodic signal output from said oscillator means in accordance with a signal input externally from a chip, said signal determining an operation mode of a circuit formed on said semiconductor substrate;

wherein said oscillator means includes capacitors, and said selection means switches between a connected state where said capacitors are electrically connected to said oscillator means and a disconnected state where said capacitors are electrically disconnected from said oscillator means in response to said signal externally input from said chip so as to vary the oscillation period of said oscillator means.

2. An apparatus according to claim 1, wherein said externally input signal is a signal for switching between a normal state and a self-refresh state, and said selection means receives said externally input signal and controls said oscillator means so as to make said oscillation period longer for said self-refresh state than said normal state.

3. An apparatus according to claim 1, wherein said externally input signal is a signal for switching between a chip active state and a chip standby state, and said selection means receives said externally input signal and controls said oscillator means so as to make said oscillation period longer for said chip standby state than said chip active state.

4. An apparatus according to claim 1, wherein said oscillator means is a ring oscillator.

5. An apparatus according to claim 2, wherein said oscillator means is a ring oscillator.

6. An apparatus according to claim 3, wherein said oscillator means is a ring oscillator.

7. An apparatus according to claim 2, wherein the apparatus is adapted to enter said normal state upon power-on.

8. A substrate potential adjusting apparatus comprising:

pump means for drawing a current from a semiconductor substrate to adjust a substrate potential;

oscillator means for supplying a periodic signal to said pump means and causing said pump means to operate;

control means for detecting a potential of said semiconductor substrate and for controlling switching of said oscillator means between operation and non-operation in accordance with said detected potential;

selection means for changing the oscillation period of said periodic signal output from said oscillator means in accordance with a signal input externally from a chip, said signal determining an operation mode of a circuit formed on said semiconductor substrate;

said externally input signal being a signal for switching between a normal state and a self-refresh state, and said selection means receiving said externally input signal and controlling said oscillator means, so as to make said oscillation period longer for said self-refresh state than said normal state, wherein said oscillator means comprises a plurality of oscillator circuits each outputting a said periodic signal having a different period, and said selection means selectively causes one of said plurality of oscillator circuits to operate to supply a said periodic signal from said selected oscillator circuit to said pump means.

9. An apparatus to claim 8, wherein said selection means receives said externally input signal and selects one of said oscillator circuits in said self-refresh state and selects another of said oscillator circuits in said normal state, and said one of said oscillator circuits outputs said periodic signal longer than said periodic signal output by said another of said oscillator circuits.

10. An apparatus according to claim 9, wherein said oscillator means is a ring oscillator.

11. An apparatus according to claim 8, wherein said oscillator means is a ring oscillator.

12. A substrate potential adjusting apparatus comprising:

pump means for drawing a current from a semiconductor substrate to adjust a substrate potential;

oscillator means for supplying a periodic signal to said pump means and causing said pump means to operate;

control means for detecting a potential of said semiconductor substrate and for controlling switching of said oscillator means between operation and non-operation in accordance with said detected potential; and selection means for changing the oscillation period of said periodic signal output from said oscillator means in accordance with a signal input externally from a chip, said signal determining an operation mode of a circuit formed on said semiconductor substrate;

said externally input signal being a signal for switching between a chip active state and a chip standby state, and said selection means receiving said externally input signal and controlling said oscillator means, so as to make said oscillation period longer for said chip standby state than said chip active state.

wherein said oscillator means comprises a plurality of oscillator circuits each outputting a said periodic signal having a different period, and said selection means selectively causes one of said plurality of oscillator circuits to operate to supply a said periodic signal from said selected oscillator circuit to said pump means.

13. An apparatus according to claim 12, wherein said selection means receives said externally input signal, and selects one of said oscillator circuits in said chip standby state and selects another of said oscillator circuits in said chip active state, said one of said oscillator circuits outputting said periodic signal longer than said periodic signal outputted by said another of said oscillator circuits.

14. An apparatus according to claim 12, wherein said oscillator means is a ring oscillator.

15. An apparatus according to claim 13, wherein said oscillator means is a ring oscillator.

* * * * *